US007602225B2

(12) United States Patent
Seo et al.

(10) Patent No.: US 7,602,225 B2
(45) Date of Patent: Oct. 13, 2009

(54) POWER ON RESET CIRCUIT FOR A DIGITAL DEVICE INCLUDING AN ON-CHIP VOLTAGE DOWN CONVERTER

(75) Inventors: Donghyun Seo, Seoul (KR); Jacopo Mulatti, Latisana (IT); Taegyoung Kang, Kyoungki-do (KR)

(73) Assignees: STMicroelectronics S.r.l., Agrate Brianza (Mi) (IT); STMicroelectronics Asia Pacific Pte. Ltd., Singapore (SG); Hynix Semiconductor, Inc., Kyounki-do (KR)

( * ) Notice: Subject to any disclaimer, the term of this patent is extended or adjusted under 35 U.S.C. 154(b) by 0 days.

(21) Appl. No.: 11/829,413

(22) Filed: Jul. 27, 2007

(65) Prior Publication Data

US 2008/0048743 A1    Feb. 28, 2008

(30) Foreign Application Priority Data

Jul. 28, 2006    (EP)    ................................. 06425538

(51) Int. Cl.
*H03K 3/02*    (2006.01)
(52) U.S. Cl. .......................... 327/198; 327/142; 327/143
(58) Field of Classification Search ................. 327/142, 327/143, 198
See application file for complete search history.

(56) References Cited

U.S. PATENT DOCUMENTS 4,812,679 A    3/1989    Mahabadi ................. 307/272.1

5,519,347 A    5/1996    Kim ............................ 327/143
5,936,443 A *  8/1999    Yasuda et al. ................ 327/143
2002/0031032 A1    3/2002    Ooishi ......................... 365/226

FOREIGN PATENT DOCUMENTS

WO    2004/057449    7/2004

OTHER PUBLICATIONS

Machine Design, "*What to Do When the Power Goes Out*"; Apr. 11, 1991; vol. 63, No. 7, Cleveland, Ohio.

* cited by examiner

*Primary Examiner*—Lincoln Donovan
*Assistant Examiner*—Patrick O'Neill
(74) *Attorney, Agent, or Firm*—Allen, Dyer, Doppelt, Milbrath & Gilchrist, P.A.

(57) ABSTRACT

A power on reset circuit initializes at power on a digital integrated circuit, and includes a first power on reset signal generator powered by an external power supply voltage and generates a first power on reset signal. A reference voltage generator is powered by the external power supply voltage, and is enabled by the first power on reset signal for generating a stable compensating reference voltage. A voltage down converter circuit receives the reference voltage and is enabled by the first power on reset signal, and converts the external applied power supply voltage to a stable regulated internal supply voltage. A second power on reset signal generator circuit receives the regulated internal supply voltage, and is enabled by the first power on reset signal for generating a second power on reset signal for core parts of the digital integrated circuit for initializing them at power on.

22 Claims, 12 Drawing Sheets

|  | VPOR_TH+ | FUSE BURNING CONDITIONS | | | |
|---|---|---|---|---|---|
|  |  | FU 1 | FU 2 | FD 1 | FD 2 |
| UP TRIMMING | VTH0+dVth*2 | X | - | - | - |
|  | VTH0+dVth*1 | X | X | - | - |
| NO TRIMMING | VTH0 | - | - | - | - |
| DOWN TRIMMING | VTH0-dVth*1 | - | - | X | - |
|  | VTH0-dVth*2 | - | - | X | X |

VTH0: TARGET THRESHOLD VOLTAGE OF POR_TH+  
dVth: UNIT OF POR THRESHOLD VOLTAGE SHIFTING  
X: BURNING FUSE

FIG. 21

|  | VPOR_TH+ | FUSE BURNING CONDITIONS | | | |
|---|---|---|---|---|---|
|  |  | FU 1 | FU 2 | FD 1 | FD 2 |
| UP TRIMMING | 1.7+0.12=1.82V | X | - | - | - |
|  | 1.7+0.06=1.76V | X | X | - | - |
| NO TRIMMING | VTH0=1.70V | - | - | - | - |
| DOWN TRIMMING | 1.7-0.06=1.64V | - | - | X | - |
|  | 1.7-0.12=1.58V | - | - | X | X |

VTHmeas=1.80V  
⇒USE TRIMMING DOWNWARD ONE TIME  
⇒POR THRESHOLD IS ABOUT 1.70V

X: BURNING FUSE

FIG. 22

POWER ON RESET CIRCUIT FOR A DIGITAL DEVICE INCLUDING AN ON-CHIP VOLTAGE DOWN CONVERTER

FIELD OF THE INVENTION

The present invention relates to digital integrated circuit semiconductor devices, and in particular, to a digital device including an on-chip voltage down converter for supplying power thereto in a low-voltage mode during certain phases of operations. More precisely, the invention relates to an on-chip power on reset circuit for a digital device including the on-chip voltage down converter.

BACKGROUND OF THE INVENTION

When an electronic system is switched on, an external power supply voltage (VDDE) is supplied to various component integrated circuit semiconductor devices, and ramps up during a certain tRAMP time interval. The status of a digital semiconductor device is generally preset or initialized during power on once the supply voltage of the integrated circuits in the device has reached a correct level. This is done to start operations correctly at the end of the power on phase.

A power on reset (POR) generator integrated in the device is used for initialization during power on. The generated POR signal is high until VDDE reaches a predetermined level (VPOR+), which is required for the initialization during power on. Thereafter, the POR signal switches to low and the semiconductor device operates in a stand-by mode.

Figure 1:
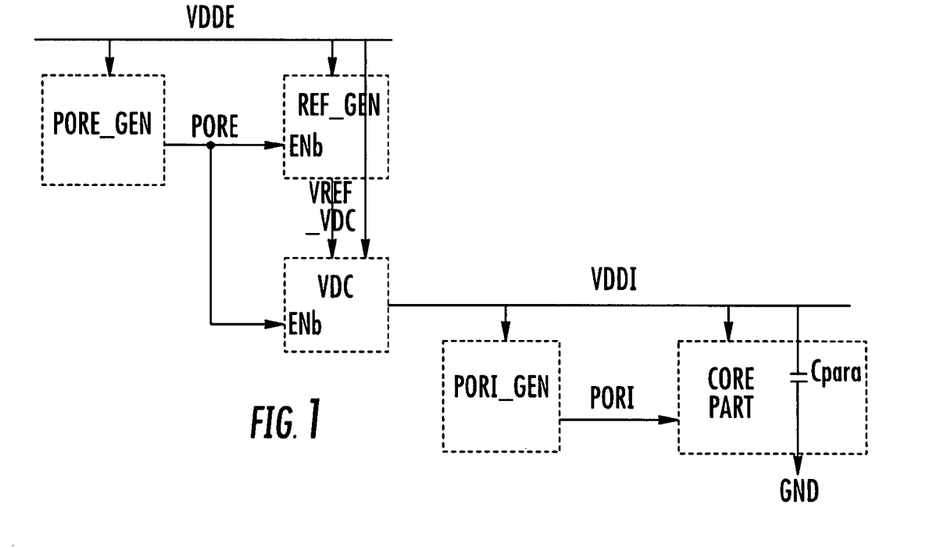
FIG. 1 is a simplified functional block diagram of a semiconductor device that includes an on-chip voltage down converter (VDC) according to the prior art.

FIG. 1 shows a simplified functional block diagram of a semiconductor device, which includes an on-chip voltage down converter (VDC). A description of each block follows.

PORE_GEN: is an external power on reset signal generator that generates the PORE signal during external power supply (VDDE) ramp up. The externally generated PORE signal has the function of resetting the REF_GEN and the VDC blocks.

REF_GEN: generates a compensated stable reference voltage (VREF_VDC) that is used in an on-chip voltage down converter VDC.

VDC: is an on-chip voltage down converter that converts VDDE to a stable regulated internal voltage supply (VDDI) using VREF_VDC for regulating it.

PORI_GEN: is an internal power on reset generator that generates the internal signal PORI when a stable regulated internal voltage supply VDDI is produced by the VDC block. The PORI signal is used for resetting and initializing core parts of the IC.

The core parts of the semiconductor device use the stable regulated internal supply voltage VDDI produced by the on-chip VDC. Typically, there is a large capacitance between VDDI and GND.

Figure 2:
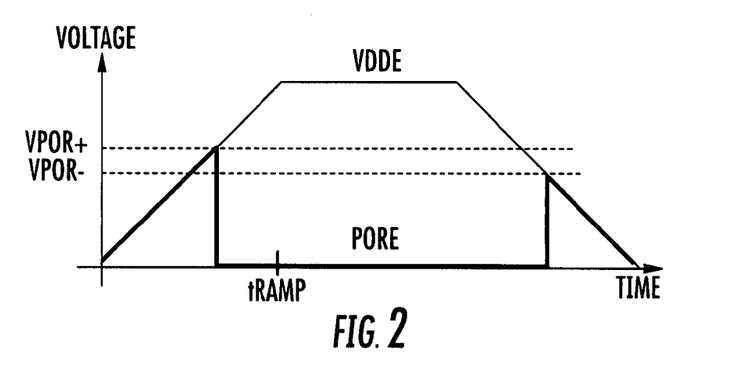
FIG. 2 is a graph showing simplified PORE dynamics when VDDE is powered up and powered down with a ramping time tRAMP according to the prior art.

FIG. 2 shows a simplified PORE dynamics when VDDE is powered up and powered down with a ramping time tRAMP. During VDDE ramp up, PORE follows VDDE, and POR is in a High state until VDDE reaches a predetermined level (VPOR_TH+: POR threshold voltage during power up); a POR High keeps the device in a reset condition. During VDDE ramp down, POR switches to a High state when VDDE is lower than VPOR_TH– (POR threshold voltage during power down). The difference between VPOR_TH+ and VPOR_TH– ensures a hysteresis for filtering out the noise in the power supply voltage during the power up period.

Figure 3:
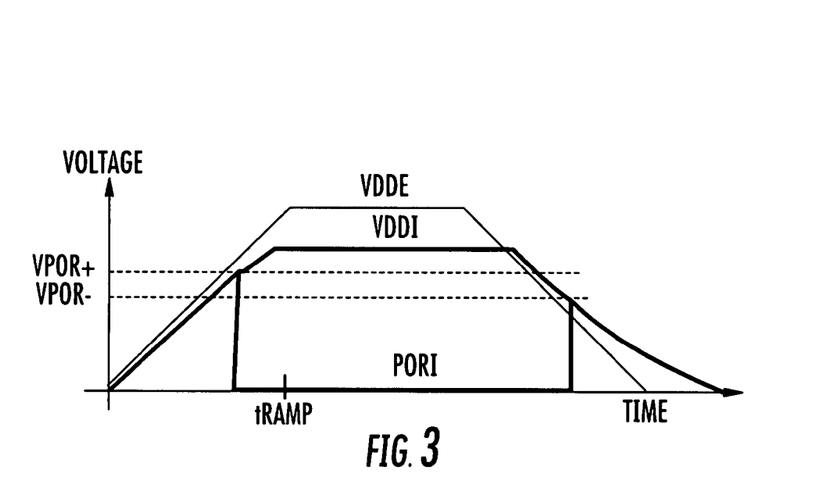
FIG. 3 is a graph showing a simplified PORI dynamics when VDDE is ramping up and down with a tRAMP time, and VDDI is being generated by an on-chip down converter of the external supply voltage VDDE according to the prior art.

FIG. 3 shows a simplified PORI dynamics when VDDE is ramping up and down with a tRAMP time, and VDDI is being generated by VDC when converting the external supplying voltage VDDE. Due to this conversion, the VDC response time induces a time lag between VDDE and VDDI during power up and down. During power down of VDDE and VDDI there is an additional time lag due to the capacitive load (Cpara) between VDDI and GND that needs time to be discharged, and GND. It may be observed that the relationship between PORI and VDDI is almost the same as that of PORE and VDDE.

Figure 4:
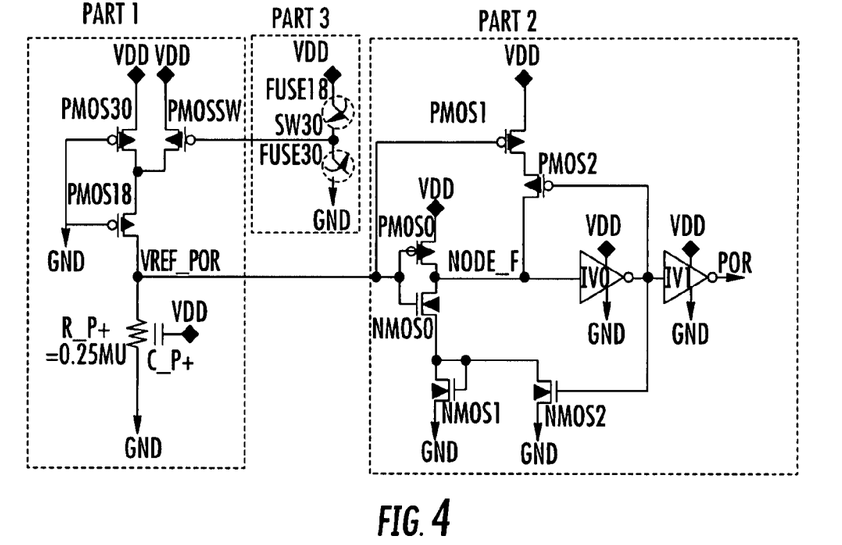
FIG. 4 is a basic circuit diagram commonly used for both the first or primary power on reset circuit PORE_GEN, and for the second or secondary power on reset circuit PORI_GEN according to the prior art.

FIG. 4 shows a basic circuit diagram used for both the first or primary power on reset circuit PORE_GEN, and for the second or secondary power on reset circuit PORI_GEN. The two circuits are identical and function with VDD equal to the external VDDE and VDDI, respectively. The circuit includes three parts, and the details of each part are explained as follows.

Part1 is a nonlinear voltage divider composed of a PMOS active resistor and a P+ diffusion passive resistor. The PMOS active resistor enhances the response time when the power up ramping time is fast. The P+ passive resistor formed on an NWELL ensures a stable resistance value with respect to process spread, and prevents possible ground bouncing during internal operations. An active P+ diffusion resistor introduces a parasitic capacitance between the P+ diffusion and VDD.

Part2 is an inverter-type level detector. The POR signal switches to low when VREF_POR reaches the logic threshold of the inverter made of PMOS0, NMOS0 and NMOS1. A feedback network connected to PMOS1, PMOS2 and NMOS2 provide for a certain hysteresis of the POR threshold voltage during power up and power down.

Part3 is an optional fuse for selecting a PMOS active resistor value in the Part1 current implemented to provide a choice between different external power supply voltage ratings of the device, such as for either a 1.8V or a 3.0V supply voltage. For example, considering the PORE_GEN, when VDD starts rising, the VREF_POR voltage evolves as a voltage ratio of the input supply voltage VDDE. When VREF_POR reaches the threshold voltage of the level detector, the NODE_F flips and the PORE signal switches to a low state for driving the device to a stand-by mode. During the stand-by mode, there is a static DC current flowing in the POR circuit according to the equation I=VREF_POR/(Resistance of P+ diffusion resistor).

Figure 5:
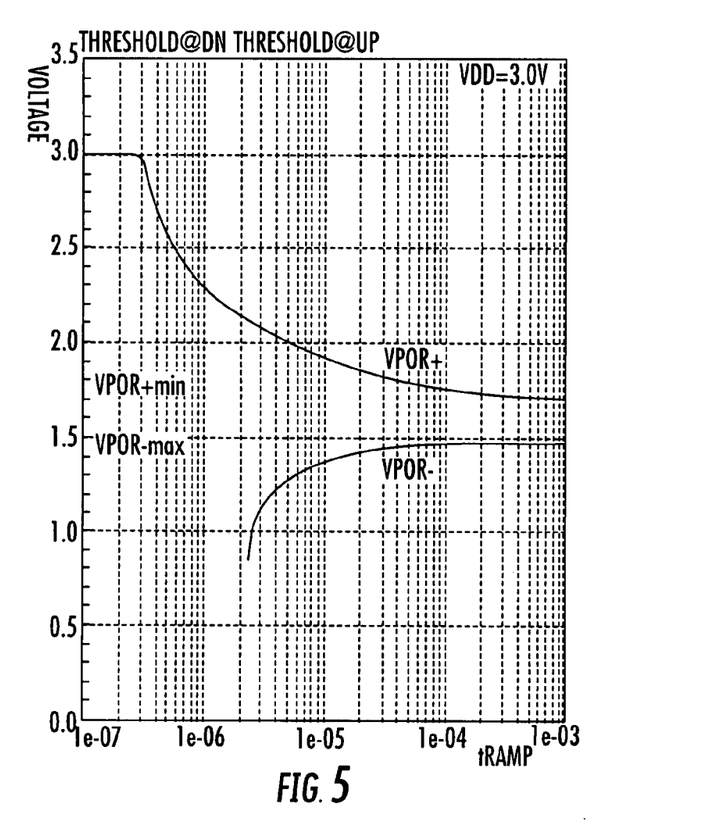
FIG. 5 is a graph showing simulation results for different tRAMPs with a power supply voltage of 3.0V, and a P+ diffusion passive resistance of 0.25 Mohm according to the prior art.

FIG. 5 shows the simulation results for different tRAMPs with VDD=3.0V and a resistance of P+0.25 Mohm. With a relatively short tRMAP (fast power up//power down), the POR signal is generated at a higher (/lower) voltage than VPOR+min (/VPOR-max) because the parasitic capacitance on VREF_POR increases its precharge (/discharge) time through the PMOS (/P+) resistor. With a relatively long tRAMP (slow power up//power down), the POR signal is generated almost coincidently with the VPOR+min (/VPOR-max).

The drawbacks of known POR circuits as the one described above may be summarized as follows. First, the known circuits are unable to work reliably when the time interval between power down and power up becomes very short.

Figure 6:
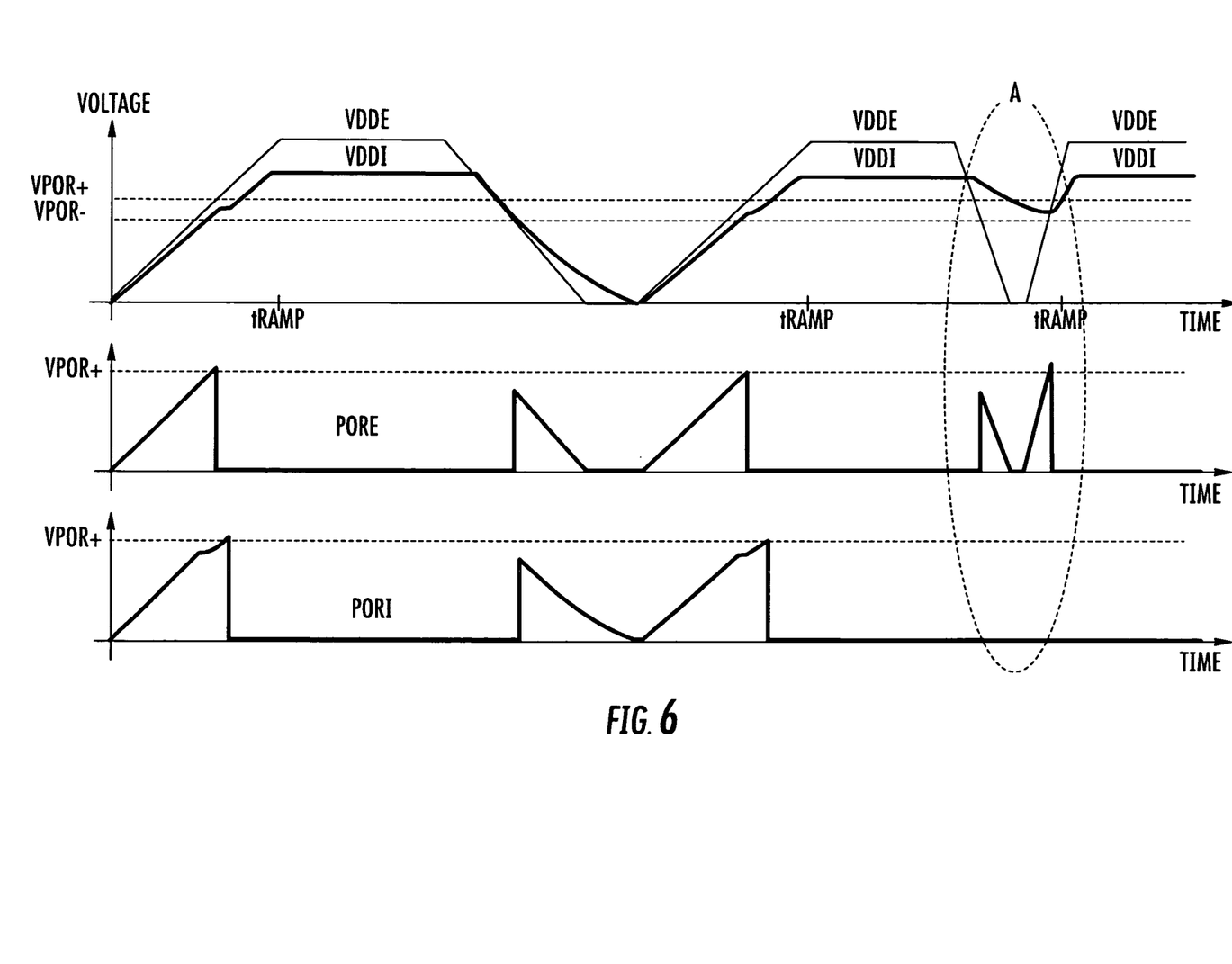
FIG. 6 is a graph showing dynamic relationships among signals VDDE, VDDI, PORE and PORI according to the prior art.

FIG. 6 shows the relationships among signals: VDDE, VDDI, PORE and PORI. When the time interval between power down and power up is short (re: dotted circle A), VDDI can not follow up VDDE because VDDI needs time to discharge the capacitive load (Cpara of FIG. 1). Therefore, the PORI does not operate correctly as it becomes unable to detect a VDDE glitch.

Secondly, the known circuits have an unwanted coupling effect caused by parasitic capacitance when the P+ resistance value is increased for reducing stand-by current absorption.

Figure 7:
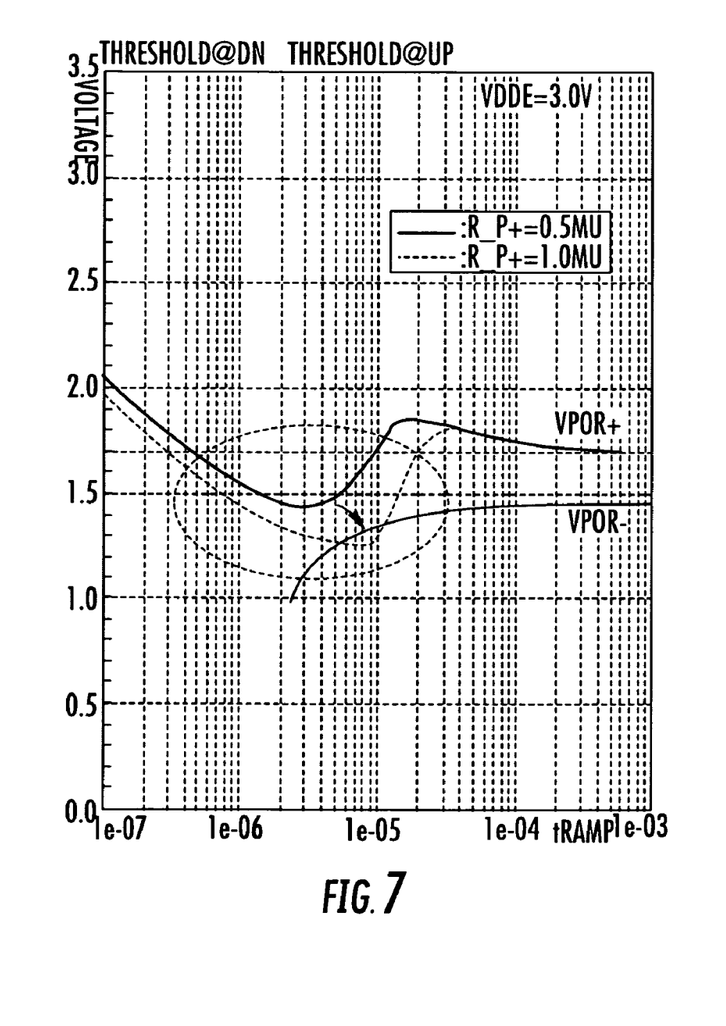
FIGS. 7 and 8 are graphs showing simulation results of a POR threshold voltage versus power up or power down times (tRAMP) with input divider resistance values of 0.5 Mohm and 1.0 Mohm, respectively, according to the prior art.
Figure 8:
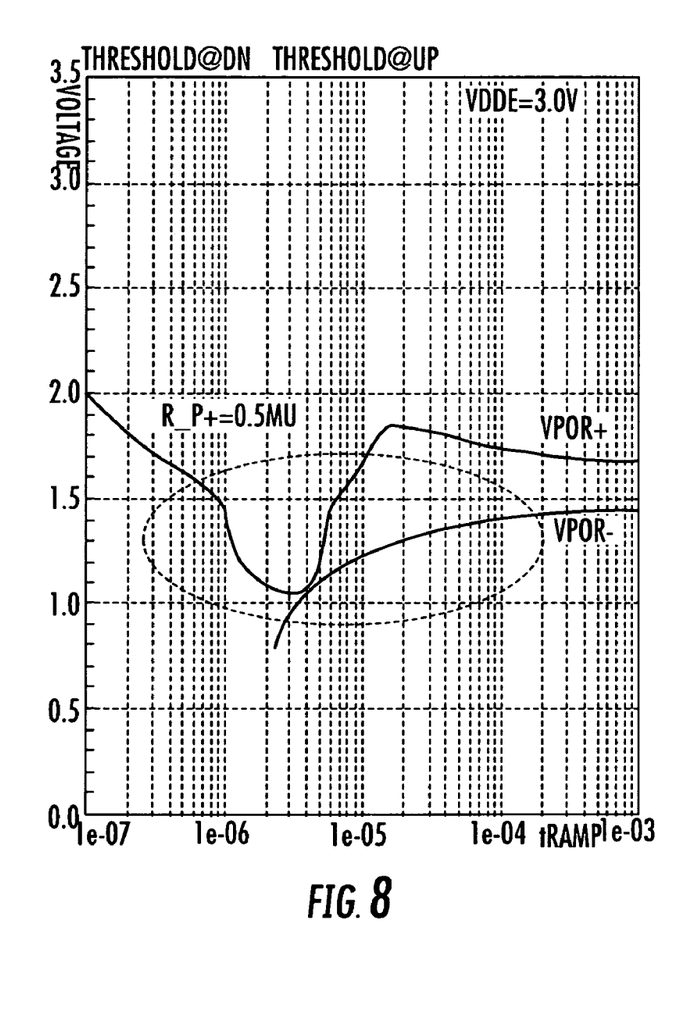

FIGS. 7 and 8 show simulation results of the POR threshold voltage versus power up or power down times (tRAMP) with resistance values of 0.5 Mohm and 1.0 Mohm, respectively, in order to assess the consequential behavior of the POR threshold voltage. FIG. 7 shows a certain lowering of the POR+ threshold voltage upon increasing the P+ resistance. Such a phenomenon can be explained by an increase of the parasitic capacitance between the enlarged P+ diffusion resistor and the supply node VDD. Of course, there are parasitic capacitances of NODE_F with respect to VDD and GND.

FIG. 8 shows the POR threshold voltage behavior as a presence of a parasitic capacitance between the inverter output node NODE_F of FIG. 4 and GND.

On another account, minimizing or reducing static DC current absorption during a stand-by mode in a POR circuit by increasing the passive resistance portion of the input supply voltage divider is a general requirement of digital devices.

Several approaches to reduce the stand-by current have been attempted. However, these attempts were unsuccessful because of following drawbacks. A first approach is replacing the P+ resistor with an N+ resistor, and increasing the resistance. With this approach, a very good POR threshold dynamics is achieved during power up, but is unsatisfactory during power down because the N+ resistor is formed on a P-substrate biased to GND. Therefore, there is a large parasitic capacitance between N+ resistor and GND.

A second approach is replacing the P+ resistor with a poly resistor and increasing the resistance. With this approach, the POR threshold dynamics is very good during power up, but again unsatisfactory during power down due to the large parasitic capacitance between the poly resistor and GND. Moreover, the resistance of the poly resistor is subject to large process variations, which results in a large spread of VPOR+.

A third approach is the use of a large P+ resistor and the addition of a compensating capacitor between VREF_POR and GND. With this approach, the POR threshold dynamics is very good during power up, but unsatisfactory during power down due to the time of discharge to GND through the P+ resistor.

SUMMARY OF THE INVENTION

In view of the foregoing background, an object of the present invention is to overcome the shortcomings of known power on reset circuits.

This and other objects, advantages and features in accordance with the present invention are provided by making the primary power on rest signal generated during external power supply voltage ramp up, not only reset the reference voltage generator and the voltage down converter, but also reset the secondary power on reset signal generator. This is based on cascading the later from the primary power on reset signal.

According to a preferred embodiment, the addition of a small junction capacitor between the output node of the input inverter of the voltage level detector of the two power on reset signal generators compensates the parasitic capacitance of the node toward ground, and prevents spurious logic changes at the node during particularly short time intervals between power off and power on phases.

The resistive divider of the input supply voltage of the two power on reset signal generators may comprise a combination of active resistances and passive resistances of different types. These may be selected, for example, by burning related fuses during an EWS testing phase. This permits optimization of stand-by current absorption through the supply voltage dividers. This may be done without compromising the dynamic response of power on reset signal generators, and without selecting a configuration designed for a certain external power supply voltage in devices supporting two different external power supply voltages.

DETAILED DESCRIPTION OF THE PREFERRED EMBODIMENTS

Figure 9:
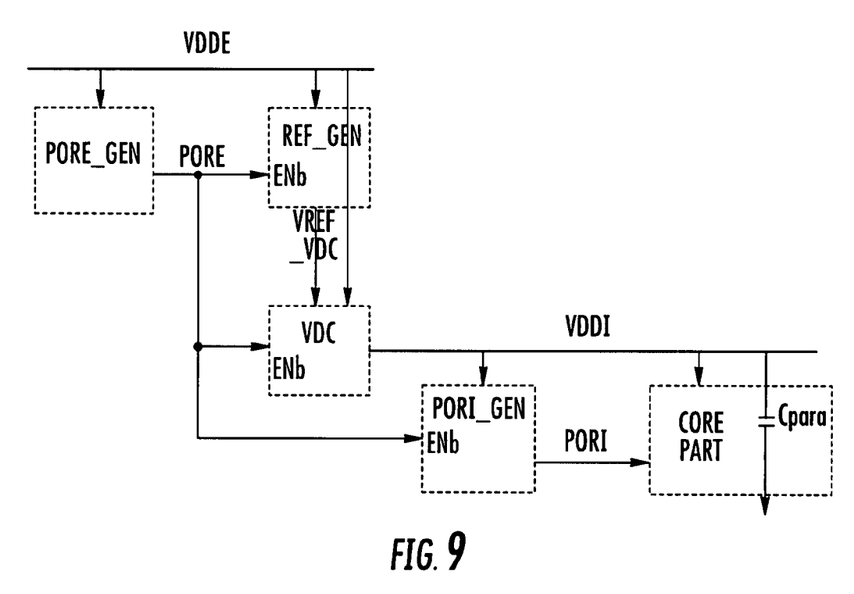
FIG. 9 is a basic circuit diagram of a semiconductor IC device with an on-chip voltage down converter according to the present invention.

FIG. 9 provides a basic functional block diagram of a semiconductor IC device with an on-chip voltage down converter (VDC) according to the invention. PORE_GEN is a power on reset generator of a first or primary PORE signal during external power supply voltage (VDDE) ramp up. This primary power on reset signal PORE is used for resetting not only the REF_GEN and the VDC blocks, but also the secondary power on reset signal generator PORI_GEN.

REF_GEN is a circuit that generates a stable compensated reference voltage (VREF_VDC) used by the on-chip voltage down converter VDC.

VDC is the on-chip voltage down converter that converts the externally applied supply voltage VDDE to a stable regulated internal supply voltage (VDDI). The reference voltage VREF_VDC is used for the regulation.

PORI_GEN is the secondary power on reset signal generator that, while VDC generates the stable regulated internal supply voltage VDDI, generates the secondary power on reset signal PORI. This secondary power on reset signal generator is also reset by the primary PORE signal during the VDDE ramp up. In other words, the primary PORE signal cascades the secondary PORI signal during power up. The secondary PORI signal is the signal used for resetting and initializing core parts of the IC.

The core parts of the semiconductor device use the stable regulated internal supply voltage VDDI produced by the on-chip voltage down converter VDC. Typically, there is a large capacitance (Cpara) between the power supply nodes VDDI and GND.

Figure 10:
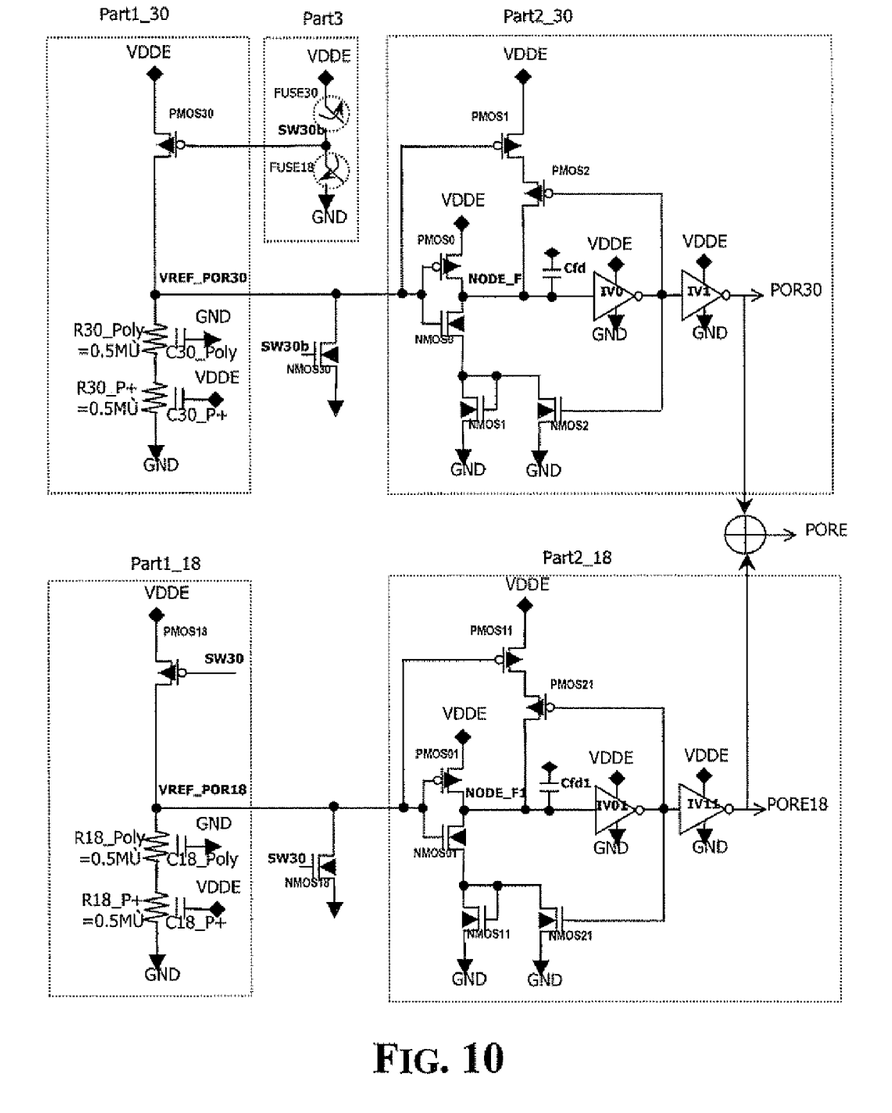
FIG. 10 is a more detailed circuit diagram of a two selectable module PORE_GEN circuit for the on-chip voltage down converter of FIG. 9.

FIG. 10 shows a circuit for the PORE_GEN. The input and the output of the PORE_GEN are respectively the external power supply voltage VDDE and PORE. The circuit contains as many POR signal generating blocks as the number of different supply voltages are supported. For example, if the device supports a 3.0V and a 1.8V operation, one block is used for the 3.0V operation while the other is used for the 1.8V operation.

The selection of the power supply voltage may be made, as shown for this embodiment, by the selection fuse (Part 3). The selection is mutually exclusive by controlling VREF_POR30 or VREF_POR18. The compositions of the circuits are as follows.

Part1_30 and Part1_18 are voltage dividers each composed of a PMOS active resistor, and P+ diffusion and Poly resistor(s). Part1_30 is used for the 3.0V operation. VREF_POR30 is determined by dividing VDDE by the ratio between the active resistor PMOS30 and the passive resistor that is a combined Poly resistor (R30_Poly) and P+ resistor (R30_P+).

The total passive resistance is increased to reduce stand-by current but the combination of poly resistor(s) and P+ diffusion resistor(s) in series for forming the passive resistance portion of the input voltage divider ensures an improved POR threshold voltage dynamics. It also reduces the capacitance coupling of the P+ diffusion during fast power up. Combination of the R30_Poly and R30_P+ resistances is optimized to compromise among stand-by current, POR threshold voltage dynamics with a wide range of power up and power down times, parasitic capacitance coupling on the P+ diffusion resistor, and process spread of resistance values.

R3_Poly is located between the VREF_POR30 node and R30_P+, otherwise the coupling on R30_R+ will not be effectively prevented. C30_Poly is a parasitic capacitance between the Poly resistor and GND, and C30_P+ is a parasitic capacitance between P+ resistor and VDDE. C30_Poly may effectively compensate the coupling effect caused by C30_P+ during fast power up.

PMOS30 active resistor increases the response time of VREF_POR30 when a power up with rather steep VDDE ramp occurs, so that the POR30 threshold voltage will be increased. Part1_18 is used for a 1.8V operation and VREF_POR18 is determined by dividing VDDE by the ratio between the active resistor PMOS18 and the P+ diffusion resistor (R18_P+). The R18_P+ value is generally moderately lower than R30_P+.

A parasitic capacitance exists between C18_P+ and VDDE. R18_P+ resistance may be optimized to compromise between stand-by current and a coupling effect. The active resistor PMOS18 increases the response time during fast power up. Therefore, the threshold voltage POR18 will increase. In case of the 1.8V operation, the requirement of a stand-by current in the POR block is less severe because the stand-by current consumption of other blocks of FIG. 9, like the VDC block, is absent. The VDC in FIG. 9 is normally disabled for the 1.8V operation. Therefore, a smaller total resistance of the input divider is tolerable. The use of either Part1_30 or Part1_18 depends on the requirement of the stand-by current, and on the parasitic capacitive coupling effect on the P+ diffusion resistor.

Part2_30 and Part2_18 are inverter-type level detectors. POR30 (POR18) switches to low when VREF_POR30 (VREF_POR18) reaches the logic threshold voltage of the inverter. The inverter includes one PMOS and two NMOS transistors (PMOS0, NMOS0 and NMOS1 for the 3.0V version; and PMOS01, NMOS01 and NMOS11 for the 1.8V version).

In addition, according to an important feature of the circuit, there is a small capacitor on NODE_F in Part2_30 (NODE_F1 in Part2_1) for compensating the parasitic capacitance toward the ground node of the NODE_F (NODE_F1). This compensation capacitor Cfd or (Cfd1) may be formed, as shown, by a P+ junction diode. By adding this small capacitance between NODE_F (or NODE_F1) to VDDE, the coupling effect on VREF_POR30 (VREFPOR18) caused by the P+ diffusion resistor is effectively compensated. Feedback connected PMOS1, PMOS2 and NNOS2 transistors (PMOS11, PMOS21 and NMOS21) ensure a certain hysteresis of the POR threshold value during power up and power down.

As stated above, Part3 is an optional fuse implementation of the external power supply voltage selection which selects the PMOS active resistor, R30_Poly resistor and R30_P+ resistor in Part1_30 and Part1_18, by the signals SW30*b* and SW30, respectively. The ability of choosing both the PMOS active resistor part and the related combination of poly and P+ passive resistors gives ample flexibility in controlling stand-by current for each selected supply voltage configuration.

3.0V operation: SW30*b* is set to a Low, and SW30 is set to a High during power up. Part1_30, Part2_30 and Part3 are activated by SW30*b* but Part1_18 and Part2_18 remain disabled. In fact, PMOS18 is off and VREF_POR18 is at a GND potential through NMOS18.

After VDDE starts rising at power up, the VREF30_POR node evolves as a voltage ratio of VDDE. When VREF30_POR reaches the threshold voltage of the inverter-type level detector, NODE_F flips and both POR30 and PORE switch to a low state, driving the device into a stand-by mode. During the stand-by mode, a static DC current flow in the PORE_GEN circuit flows but it is relatively small due to the fact that total flow path resistance is large.

1.8V operation: SW30*b* is set to a High and SW30 is set to a Low during power up. Part1_18, Part2_18 and part3 are activated by SW30. However, Part1_30 and Part2_30 are not activated by SW30*b*. In fact, PMOS30 is off, and VREF_POR30 is set to GND through NMOS30.

After VDDE starts rising at power up, the VREF18_POR node evolves as a voltage ratio of VDDE. When VREF18_POR reaches the threshold voltage of the inverter-type level detector, NODE_F1 flips and both POR18 and PORE switch to a low state, driving the device into the stand-by mode. During the stand-by mode, there is a static DC current flowing in the PORE_GEN circuit, but it is relatively small.

Figure 11:
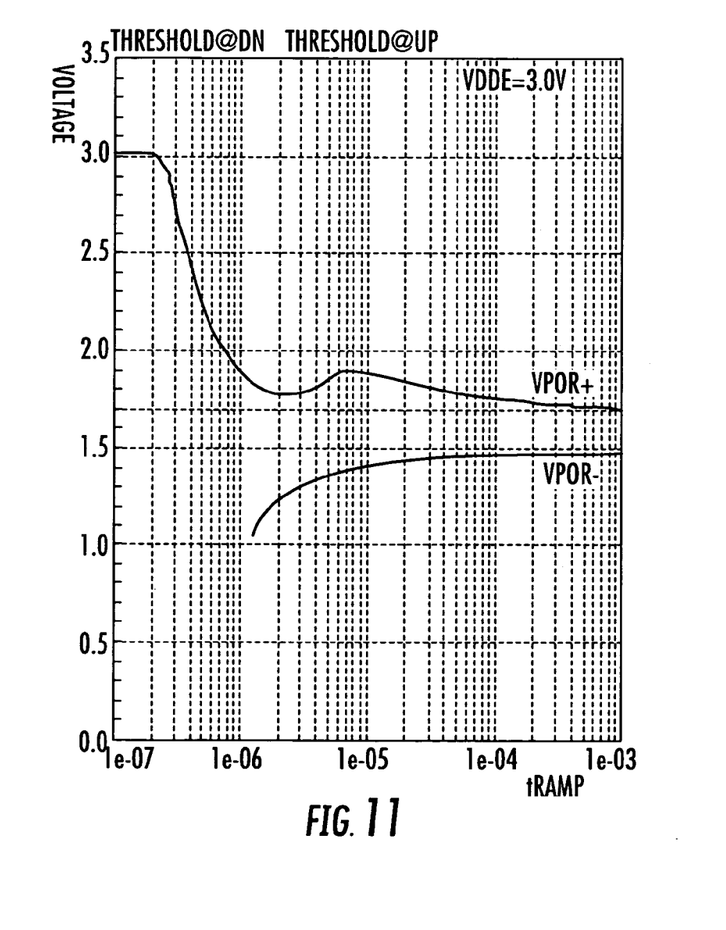
FIGS. 11 and 12 are graphs showing simulation results of a PORE threshold voltage versus tRAMP times according to the present invention.
Figure 12:
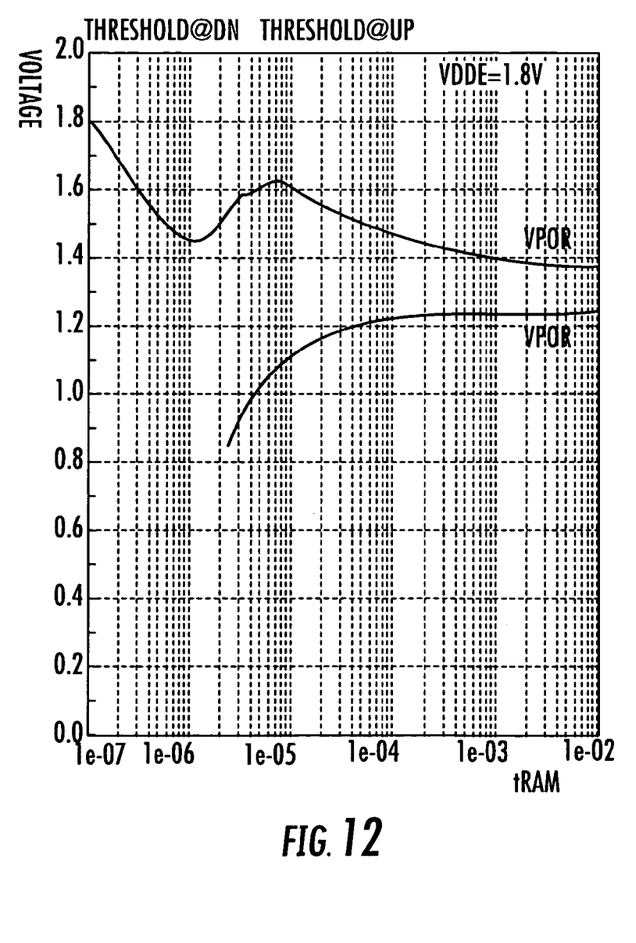

FIGS. 11 and 12 show simulation results of the PORE threshold voltage versus the tRAMP time. FIG. 11 shows the result of the 3.0V configuration, and FIG. 12 shows the result for the 1.8V configuration. The results show that the POR threshold dynamics retains excellent characteristics notwithstanding the use of a relatively large resistance on VREF_POR30 (VREF_POR18), thus keeping the stand-by current low.

Figure 13:
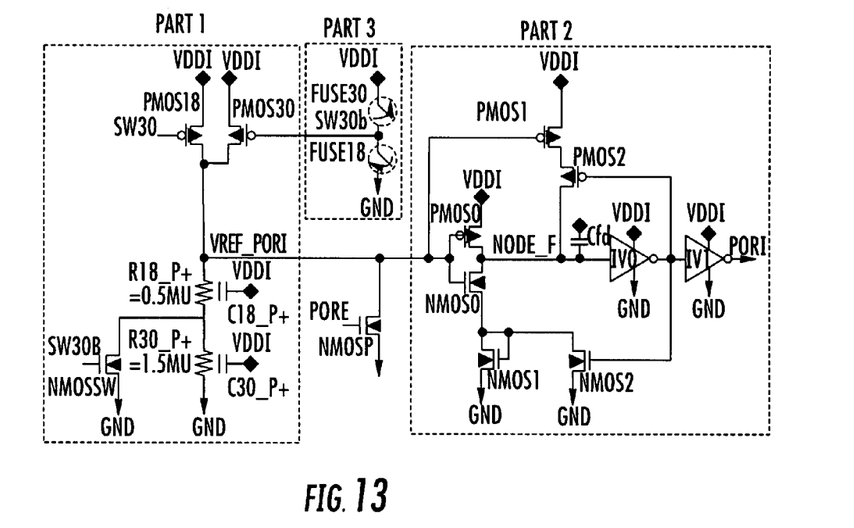
FIG. 13 is a circuit diagram of the PORI_GEN circuit of FIG. 9.

FIG. 13 shows a simplified diagram of the PORI generator. Inputs to the PORI_GEN are VDDI and the PORE signal, and its output is PORI. According to a preferred embodiment, the PORI_GEN includes three parts, the details of which follow.

Part1 is a voltage divider composed of a PMOS active resistor, and a P+ diffusion passive resistor. The P+ diffusion resistor is formed in an NWELL. C18_P+ is a parasitic capacitance on the R18_P+ resistor, and C30_P+ is a parasitic capacitance on the R30_P+ resistor. The resistance value is selected by the fuse (Part3) to adapt the input divider to the selected power supply voltage ranges. For example, if the device supports the choice between the 1.8V and 3.0V power supply voltages, then PMOS30, R18_P+ and R30_P+ are used for the 3.0V operation, and PMOS18 and R18_P+ are used for the 1.8V operation.

R18_P+ is selected by an NMOS switch transistor NMOS. The circuit operation is similar to that of the primary generator PORE_GEN. The main difference is the type of passive resistor used and the resistance value. Only a P+ diffusion type resistor is used for the passive part of the voltage divider, and the passive resistance is much larger than that of PORE_GEN. However, a relatively large passive P+ diffusion resistance, though significantly reducing stand-by current, will exhibit a capacitive coupling effect on the P+ diffusion resistor.

According to an important aspect of the illustrated circuit, the effect of an increased coupling on a larger P+ resistor is overcome by controlling the VREF_PORI input node of PORI_GEN by the primary power on reset signal PORE through the NMOS transistor switch (NMOSP).

Part2 is an inverter-type level detector. The PORI switches to a low when VREF_POR reaches the logic threshold voltage of the invert circuit, which is determined by PMOS0, NMOS0 and NMOS1. Also in the PORI_GEN circuit, a small capacitance Cfd of a P+ junction diode is connected between NODE_F and VDD to compensate for the parasitic capacitance between NODE_F and GND.

Part3 is an optional fuse for selecting the value of total resistance of the voltage divider composed of the PMOS active resistor and the P+ passive resistor.

Figure 14:
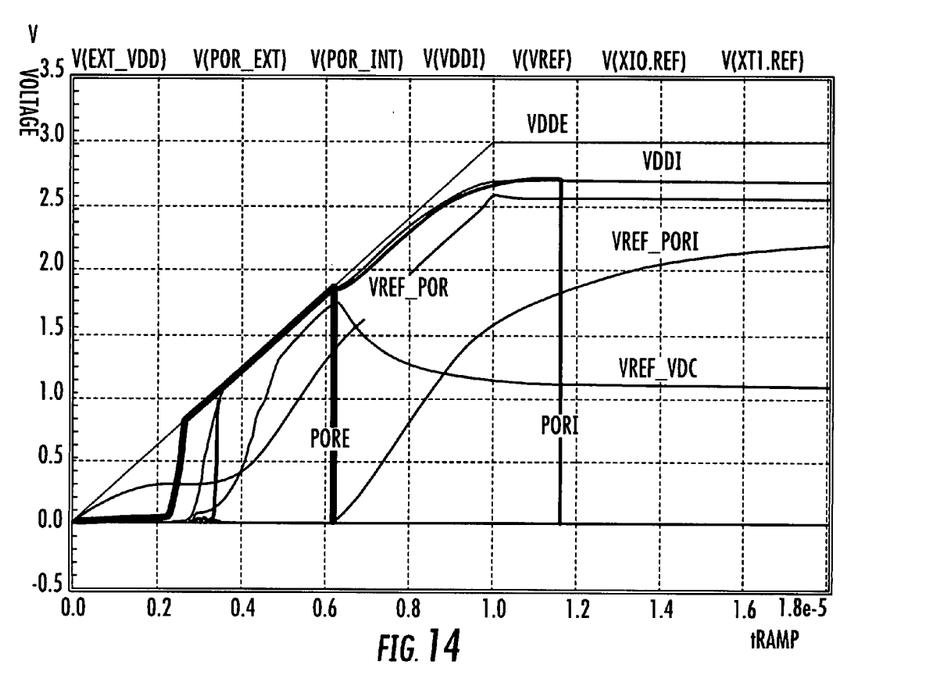
FIG. 14 is a graph showing dynamic relationships among signals in the circuit of FIG. 13.

FIG. 14 shows the relationships among the circuit signals during operation. As explained above in relation to the basic diagram of FIG. 9, VDDI is the stable regulated supply voltage produced by the internal voltage down converter VDC, and PORE is the primary power on reset signal generated from PORE_GEN.

After VDDE and VDDI starts rising at power up, the VREF_PORI node remains in a low state until the PORE signal switches to a low state. When PORE switches to the low state, the VREF_PORI node starts evolving due to the current flowing through the P+ resistor. When VREF_POR reaches the threshold voltage of the inverter-type level detector, NODE_F flips and the PORI switches to a low state for driving the device into a stand-by mode.

The waveforms demonstrate that there is not any observable effect of the capacitive coupling on the P+ diffusion resistor, notwithstanding the use of a much larger resistance on the VREF_PORI as compared to the maximum resistance that was tolerable to integrate in the known circuits.

Figure 15:
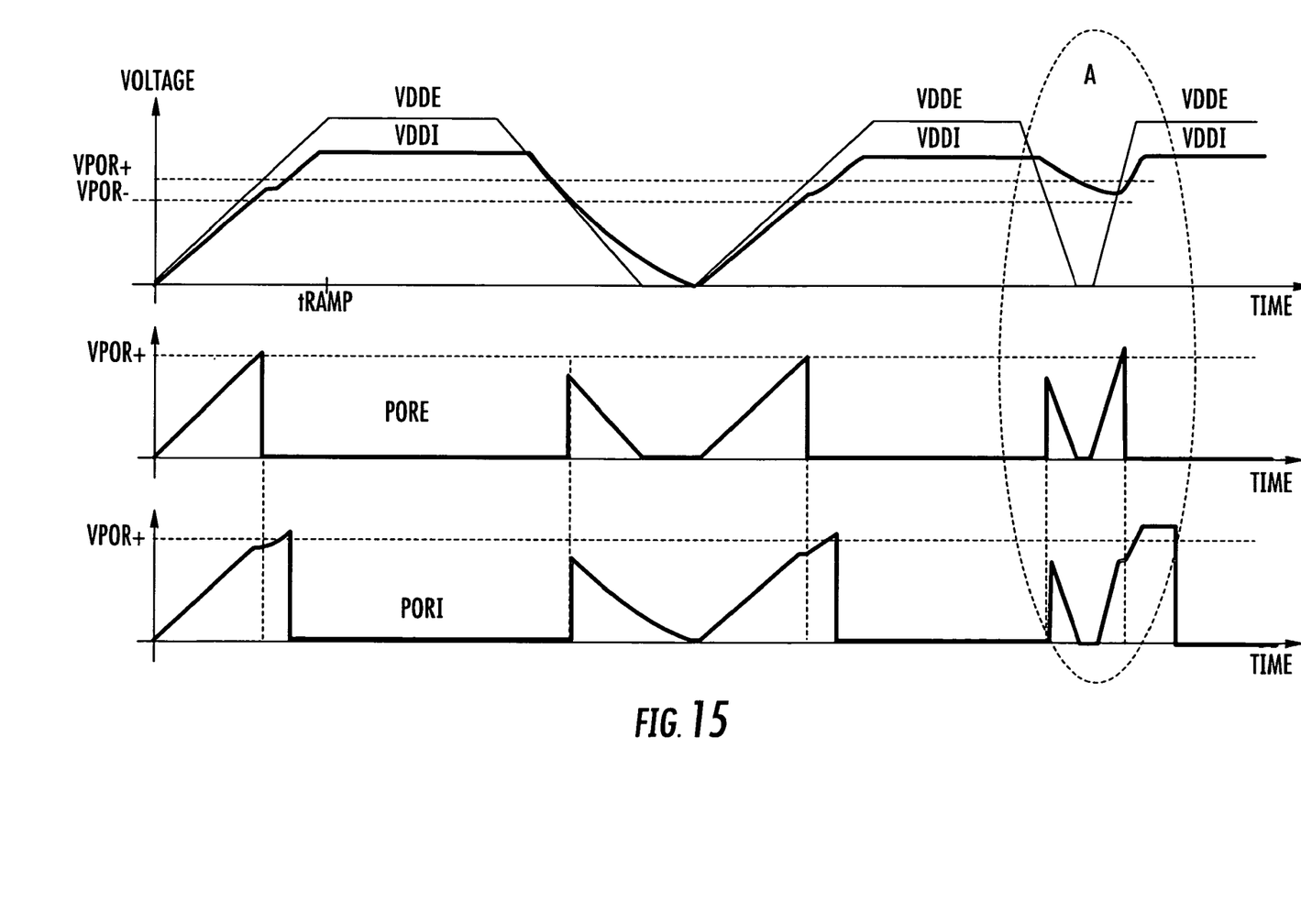
FIG. 15 is a graph showing the relationships among the signals VDDE, VDDI, PORE and PORI for a circuit according to the present invention.

FIG. 15 shows the relationships among the signals VDDE, VDDI, PORE and PORI. These plots are a summary of simulation results of a real sample circuit. Dotted perimeter A focuses on a working condition characterized by a relatively short time interval between power down and power up, or between power down and power up. It can be easily recognized that by virtue of the fact that with the illustrated circuit, wherein the PORI generator is controlled by the primary PORE signal, the PORI no longer suffers from the effects of a non-negligible time to discharge the capacitive load, as represented by the parasitic capacitance. As a result, the PORI signal evolves correctly regardless of the tRAMP time of VDDE.

The above described power on reset circuit greatly enhanced performance both in terms of reliability of operations even with reduced time intervals between on and off switching of the device, and also is useful in a variety of digital ICs. The digital ICs include devices such as, for example, NAND type flash memories that are particularly sensitive to internal signal instabilities at power on.

Moreover, the electrical properties of certain digital devices, such as flash memories, and even more so, multilevel flash memories, are subject to process spreads of significant magnitude.

For certain applications, the illustrated power on reset circuit of enhanced characteristics may be further provided with a feature for trimming the POR threshold voltage as described above. This may be determined by the combination of active resistors and passive resistors in forming the voltage divider (Part1) to be best adapted to the actual electrical characteristics of the core parts of the IC, as determined by the process spread.

Figure 16:
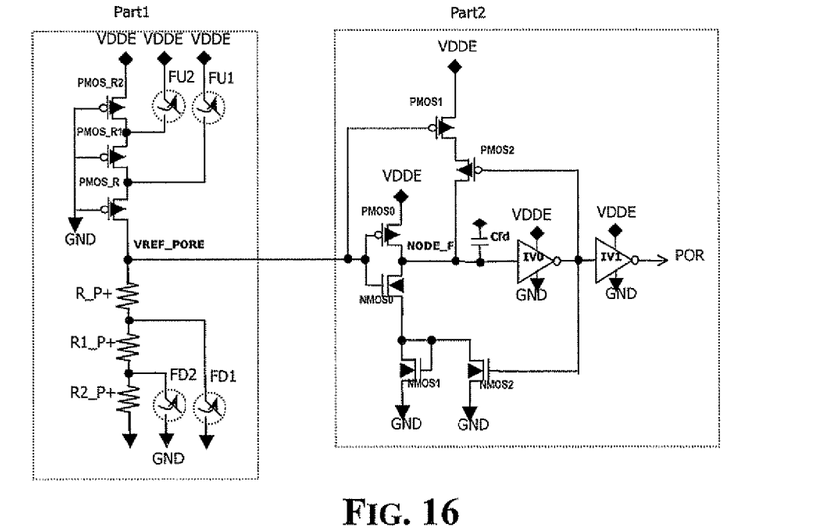
FIG. 16 is a circuit diagram providing an alternative and a preferred embodiment of the PORE_GEN generator circuit according to the present invention.

FIG. 16 is another embodiment of the PORE GEN generator and is characterized by including a plurality of selectable PMOS type active resistors, and a plurality of selectable P+ diffusion passive resistors, all connected in series, and dedicated selection fuses FU1, FU2, FD1 and FD2. The selection fuses permit, during EWS testing, to choose a certain selectable value of active resistance and a certain selectable value of passive resistance of the configured input voltage divider of Part 1 of the circuit.

Increasing the value of the PMOS active resistance lowers the level of the Vref_pore that increases the pore threshold voltage. Conversely, by decreasing the value of the P+ passive resistance, the level of the Vref_pore rises. This in turn decreases the secondary PORE GEN threshold voltage.

In case of a NAND flash memory, as well known by those skilled in the art, at least a ready/busy (/RB) output pin in the form of an open drain output is often used for indicating the status of the device. On the other hand, NAND type flash devices are generally designed to ensure various value stack assembly options. To have sufficient flexibility of a stack assembly, two such output pins (/RB) are commonly implemented in the memory device. One of which may be used for parametric/functional testing and assembly, while the other one generally remains unused.

Figure 18:
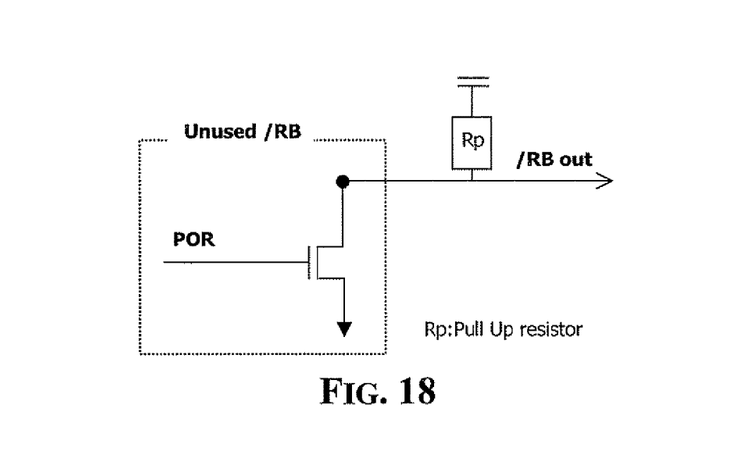

As depicted in FIG. 18, such an unused /RB pad may be exploited for permitting monitoring of the internally generated PORI signal during a power on reset threshold voltage trimming procedure, as allowed by the embodiment of the PORE GEN circuit of FIG. 16, as described above.

Figure 17:
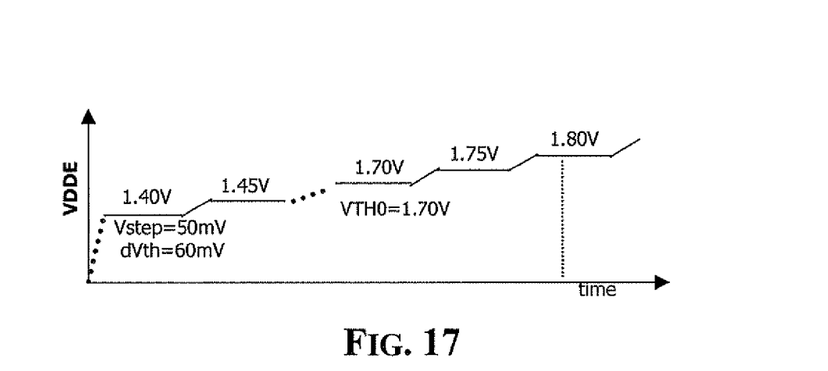
FIGS. 17-22 relate to a power on reset circuit trimming procedure implemented before parametric and functional testing of a NAND flash memory device provided with the power on reset circuit of FIG. 16.
Figure 19:
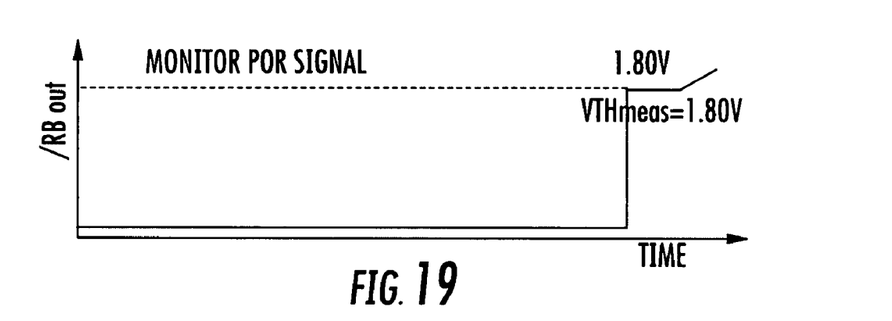

A procedure that may be implemented before parametric and functional test of the device includes the steps of:

step 1) applying to the device an external supply voltage (VDDE) through a staircase ramp up, as graphically depicted in FIG. 17;

step 2) monitoring through the available spare RB pad of the device or through a dedicated pad, the evolution of the power on reset signal, a result of which is depicted in FIG. 19;

step 3) if the POR threshold level is high, go back to the first step, and if pore threshold level is low continue with the next step;

step 4) reading the VDDE voltage while the POR level is low such that the read voltage gives a measured POR threshold voltage (VTH meas);

step 5) extracting the POR threshold trimming information based on the measured POR threshold voltage (VTH meas .);

step 6) trimming down or up, depending on the difference between the measured POR threshold voltage (VTH meas.) and the target POR threshold voltage Vpore_TH+(VTH0), according to the minimum trimming voltage difference implemented in the trimmable input voltage divider of the PORE GEN circuit of FIG. 16; and step 7) burning the selected fuses.

Figure 20:
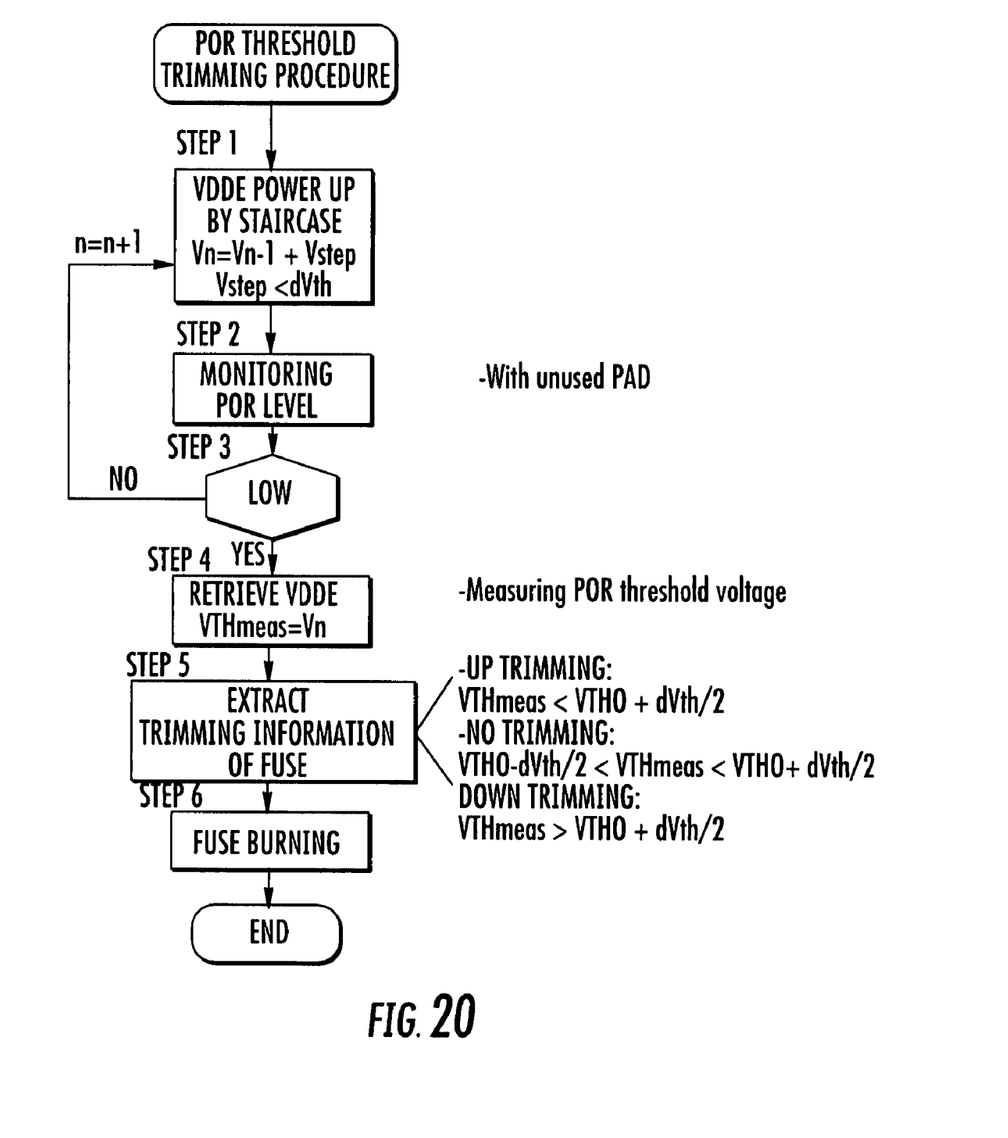
Figure 21:
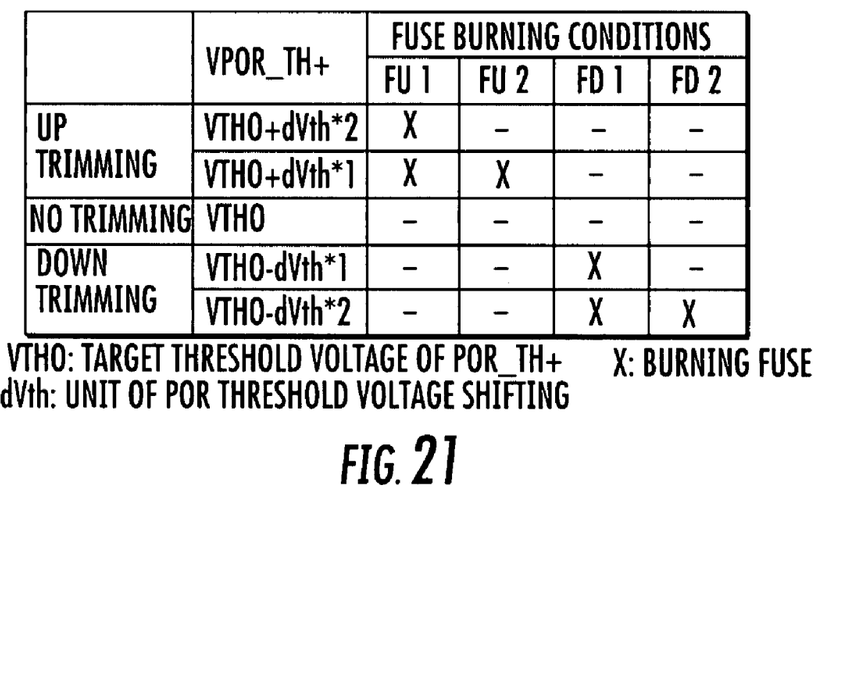
Figure 22:
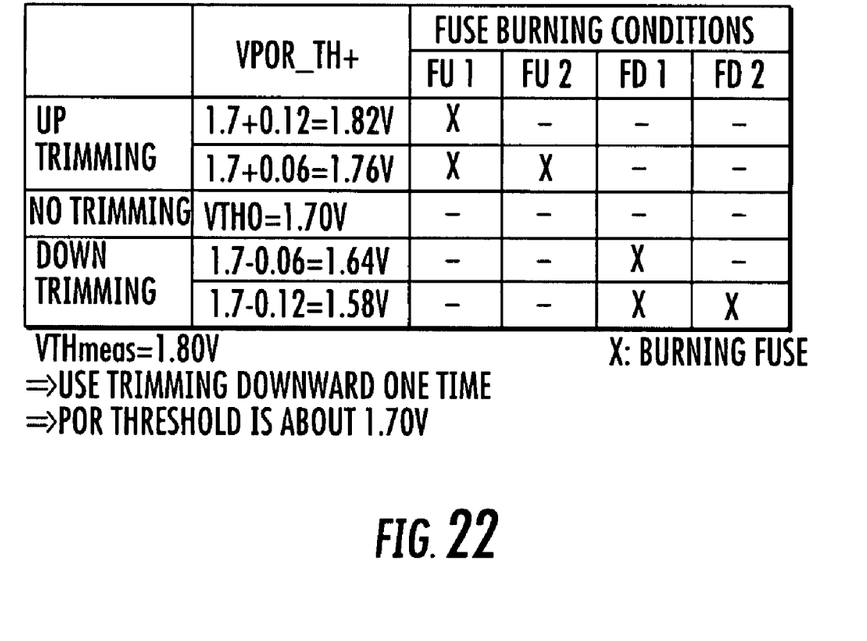

The above described procedure is graphically illustrated in the form of a flow chart in FIG. 20. After having read the measured POR threshold voltage, the fuse trimming information to obtain the target threshold voltage (VTH0) can be determined by referring to a table, as the one shown in FIG. 21. Actual values for the tested experimental device are indicated in the table of FIG. 22.

That which is claimed:

1. A power on reset circuit for initializing a digital integrated circuit at power on, and comprising:
    a first power on reset signal generator to be supplied by an external power supply voltage, and to generate a first power on reset signal during ramp up of the external power supply voltage;
    a reference voltage generator to be supplied by the external power supply voltage, and to generate a reference voltage;
    a voltage down converter to use the generated reference voltage to convert the external power supply voltage to a regulated internal supply voltage; and
    a second power on reset signal generator to be supplied by the regulated internal supply voltage, and to generate a second power on reset signal to initialize the digital integrated circuit at power on;
    said first power on reset signal generator to enable said reference voltage generator, said voltage down converter and said second power on reset signal generator with the first power on reset signal.

2. The power on reset circuit of claim 1, wherein each of said first and second power on reset generators comprises:
    a first part comprising a non-linear voltage divider comprising an active resistance and a passive resistance with an intermediate node therebetween; and
    a second part comprising an inverter-type level detector including an input node and an output node, the input node coupled to the intermediate node of said non-linear voltage divider, and comprising a compensation capacitor to compensate for a parasitic capacitance associated with the output node.

3. The power on reset circuit of claim 2, wherein each of said active resistance and said passive resistance in said first part of said first power on reset signal generator comprises a plurality of series connected components being individually selectable; and wherein said first part further comprises at least one first by-pass fuse coupled to said plurality of series connected components in said active resistance, and at least one second bypass fuse coupled to said plurality of series connected components in said passive resistance to trim dynamic response and current absorption characteristics during testing.

4. The power on reset circuit of claim 1, wherein said first power on reset signal generator comprises two mutually exclusive selectable modules for two different external power supply voltages, the two different external power supply voltages corresponding to a low supply voltage mode and a high supply voltage mode.

5. The power on reset circuit of claim 4, wherein each module comprises a voltage divider comprising:
    an active resistance corresponding to the high supply voltage mode, and comprising a transistor; and
    a passive resistance corresponding to the low supply voltage mode, and comprising a plurality of series connected resistors.

6. The power on reset circuit of claim 5, wherein said transistor comprises a PMOS transistor; and wherein said plurality of resistors in said passive resistance comprises a P+ diffusion resistor and at least one additional polysilicon resistor in series with said P+ diffusion resistor.

7. The power on reset circuit of claim 5, wherein each module further comprises at least one fuse to couple a control terminal of said transistor to a first voltage reference to select the high supply voltage mode, and to couple the control terminal of said transistor to a second voltage reference to select. the low supply voltage mode.

8. A memory device comprising:
    at least one circuit portion; and
    a power on reset circuit to initialize said at least one circuit portion, and comprising
        a first power on reset signal generator to be supplied by an external power supply voltage, and to generate a first power on reset signal during ramp up of the external power supply voltage,
        a reference voltage generator to be supplied by the external power supply voltage, and to generate a reference voltage,
        a voltage down converter to use the generated reference voltage to convert the external power supply voltage to a regulated internal supply voltage, and
        a second power on reset signal generator to be supplied by the regulated internal supply voltage, and to generate a second power on reset signal to initialize the digital integrated circuit at power on,
        said first power on reset signal generator to enable said reference voltage generator, said voltage down converter and said second power on reset signal generator with the first power on reset signal.

9. The memory device of claim 8, wherein each of said first and second power on reset generators comprises:
    a first part comprising a nonlinear voltage divider comprising an active resistance and a passive resistance with an intermediate node therebetween; and
    a second part comprising an inverter-type level detector including an input node and an output node, the input node coupled to the intermediate node of said non-linear voltage divider, and comprising a compensation capacitor to compensate for a parasitic capacitance associated with the output node.

10. The memory device of claim 9, wherein each of said active resistance and said passive resistance in said first part of said first power on reset signal generator comprises a plurality of series connected components to be individually selectable; and wherein said first part further comprises at least one first by-pass fuse coupled to said plurality off series connected components in said active resistance, and at least one second by-pass fuse coupled to said plurality of series connected components in said passive resistance to trim dynamic response and current absorption characteristics during testing.

11. The memory device of claim 8, wherein said first power on reset signal generator comprises two mutually exclusive selectable modules for two different external power supply voltages, the two different external power supply voltages corresponding to a low supply voltage mode and a high supply voltage mode.

12. The memory device of claim 11, wherein each module comprises a voltage divider comprising:
   an active resistance corresponding to the high supply voltage mode, and comprising a transistor; and
   a passive resistance corresponding to the low supply voltage mode, and comprising a plurality of series connected resistors.

13. The memory device of claim 12, wherein said transistor comprises a PMOS transistor; and wherein said plurality of resistors in said passive resistance comprises a P+ diffusion resistor and at least one additional polysilicon resistor in series with said P+ diffusion resistor.

14. The memory device of claim 12, wherein each module further comprises at least one fuse to couple a control terminal of said transistor to a first voltage reference to select the high supply voltage mode, and to couple the control terminal of said transistor to a second voltage reference to select the low supply voltage mode.

15. The memory device of claim 8, wherein said at least one circuit portion is configured so that the memory device is a NAND type flash memory.

16. A method for initializing a digital integrated circuit at power on with a power on reset circuit comprising a first power on reset signal generator, a reference voltage generator, a voltage down converter and a second power on reset signal generator, the method comprising:
   supplying an external power supply voltage to the first power on reset signal generator for generating a first power on reset signal during ramp up of the external power supply voltage;
   supplying the external power supply voltage to the reference voltage generator for generating a reference voltage;
   using the generated reference voltage at the voltage down converter for converting the external power supply voltage to a regulated internal supply voltage;
   supplying the regulated internal supply voltage to the second power on reset signal generator for generating a second power on reset signal for initializing the digital integrated circuit at power on; and
   the first power on reset signal generated by the first power on reset signal generator enabling the reference voltage generator, the voltage down converter and the second cower on reset signal generator.

17. The method of claim 16, wherein each of the first and second power on reset generators comprises:
   a first part comprising a non-linear voltage divider comprising an active resistance and a passive resistance with an intermediate node therebetween; and
   a second part comprising an inverter-type level detector including an input node and an output node, the input node being coupled to the intermediate node of the non linear voltage divider, and comprising a compensation capacitor to compensate for a parasitic capacitance associated with the output node.

18. The method of claim 17, wherein each of the active resistance and the passive resistance in the first part of the first power on reset signal generator comprises a plurality of series connected components being individually selectable; and wherein the first part further comprises at least one first bypass fuse coupled to the plurality of series connected components in the active resistance, and at least one second bypass fuse coupled to the plurality of series connected components in the passive resistance for trimming dynamic response and current absorption characteristics during testing.

19. The method of claim 16, wherein the first power on reset signal generator comprises two mutually exclusive selectable modules for two different external power supply voltages, the two different external power supply voltages corresponding to a low supply voltage mode and a high supply voltage mode.

20. The method of claim 19, wherein each module comprises a voltage divider comprising:
   an active resistance corresponding to the high supply voltage mode, and comprising a transistor; and
   a passive resistance corresponding to the low supply voltage mode, and comprising, a plurality of series connected resistors.

21. The method of claim 20, wherein the transistor comprises a PMOS transistor; and wherein the plurality of resistors in the passive resistance comprises a P+ diffusion resistor and at least one additional polysilicon resistor in series with the P+ diffusion resistor.

22. The method of claim 20, wherein each module further comprises at least one fuse for coupling a control terminal of the transistor to a first voltage reference for selecting the high supply voltage mode, and for coupling the control terminal of the transistor to a second voltage reference for selecting the low supply voltage mode.

* * * * *

UNITED STATES PATENT AND TRADEMARK OFFICE
CERTIFICATE OF CORRECTION

PATENT NO. : 7,602,225 B2  Page 1 of 1
APPLICATION NO. : 11/829413
DATED : October 13, 2009
INVENTOR(S) : Seo et al.

It is certified that error appears in the above-identified patent and that said Letters Patent is hereby corrected as shown below:

| | |
|---|---|
| Column 5, Line 48 | Delete: "R3_Poly"<br>Insert: --R30_Poly-- |
| Column 6, Line 26 | Delete: "NNOS2"<br>Insert: --NMOS2-- |
| Column 9, Line 62 | Delete: "bypass"<br>Insert: --by-pass-- |
| Column 10, Line 62 | Delete: "off"<br>Insert: --of-- |
| Column 12, Line 2 | Delete: "cower"<br>Insert: --power-- |
| Column 12, Line 19 | Delete: "bypass"<br>Insert: --by-pass-- |
| Column 12, Line 21 | Delete: "bypass"<br>Insert: --by-pass-- |

Signed and Sealed this

Eighth Day of June, 2010

David J. Kappos
*Director of the United States Patent and Trademark Office*